United States Patent
Franchini et al.

(10) Patent No.: US 9,461,639 B2
(45) Date of Patent: Oct. 4, 2016

(54) SEMICONDUCTOR DEVICE AND POWER CIRCUIT INCLUDING A SENSE TRANSISTOR FOR CURRENT SENSING

(71) Applicants: Christelle Franchini, Fontenilles (FR); Murielle Delage, Fonsorbes (FR); Alexis Nathanaël Huot-Marchand, Fonsorbes (FR)

(72) Inventors: Christelle Franchini, Fontenilles (FR); Murielle Delage, Fonsorbes (FR); Alexis Nathanaël Huot-Marchand, Fonsorbes (FR)

(73) Assignee: Freescale Semiconductor, Inc., Austin, TX (US)

( * ) Notice: Subject to any disclaimer, the term of this patent is extended or adjusted under 35 U.S.C. 154(b) by 127 days.

(21) Appl. No.: 14/556,365

(22) Filed: Dec. 1, 2014

(65) Prior Publication Data
US 2015/0341029 A1 Nov. 26, 2015

(30) Foreign Application Priority Data
May 16, 2014 (WO) .................. PCT/IB2014/001072

(51) Int. Cl.
| | | |
|---|---|---|
| G05F 1/00 | (2006.01) | |
| H03K 17/687 | (2006.01) | |
| H01L 27/02 | (2006.01) | |
| H01L 29/78 | (2006.01) | |
| H01L 29/06 | (2006.01) | |
| H01L 25/16 | (2006.01) | |
| H01L 21/8234 | (2006.01) | |
| H01L 27/088 | (2006.01) | |
| G05F 3/02 | (2006.01) | |
| H02M 3/156 | (2006.01) | |
| G05F 1/565 | (2006.01) | |

(52) U.S. Cl.
CPC ..... *H03K 17/687* (2013.01); *H01L 21/823418* (2013.01); *H01L 25/16* (2013.01); *H01L 27/0266* (2013.01); *H01L 27/088* (2013.01); *H01L 29/0642* (2013.01); *H01L 29/78* (2013.01); *H01L 29/7817* (2013.01); *H01L 29/7826* (2013.01); *G05F 1/565* (2013.01); *G05F 3/02* (2013.01); *H01L 2924/0002* (2013.01); *H02M 3/156* (2013.01); *H03K 2217/0027* (2013.01)

(58) Field of Classification Search
None
See application file for complete search history.

(56) References Cited

U.S. PATENT DOCUMENTS 5,063,307 A * 11/1991 Zommer ............. H01L 27/0248
257/467
5,408,141 A * 4/1995 Devore .............. H03K 17/0822
257/341

(Continued)

FOREIGN PATENT DOCUMENTS

EP 1174720 A2 1/2002

*Primary Examiner* — Tuan T Lam
(74) *Attorney, Agent, or Firm* — Charlene R. Jacobsen

(57) ABSTRACT

A semiconductor device comprises a power transistor and a sense transistor. The power transistor conducts a power transistor current. The sense transistor conducts a sense transistor current substantially proportional to of the power transistor current. The power transistor and the sense transistor have drain source and a gate terminals, of which those of the sense transistor are arranged to be biased to those of the power transistor, respectively. The power transistor and the sense transistor each comprise: an inner region of type P−; an N-type buried layer; an N-type isolating barrier surrounding the inner region partially; an N-type source region in the inner region; an N-type drain region in the inner region. A barrier-to-drain connector connects the isolating barrier to the drain region, the one of the sense transistor has an electrical resistance which is higher than the resistance of the barrier-to-drain connector of the power transistor.

14 Claims, 4 Drawing Sheets

(56) References Cited

U.S. PATENT DOCUMENTS

| | | | | |
|---|---|---|---|---|
| 6,160,441 | A * | 12/2000 | Stratakos | G01R 19/0092 327/52 |
| 6,218,888 | B1 * | 4/2001 | Otsuki | H01L 27/0248 327/419 |
| 6,304,108 | B1 * | 10/2001 | Inn | H03K 17/0822 327/543 |
| 7,141,860 | B2 | 11/2006 | Khemka et al. | |
| 7,554,152 | B1 * | 6/2009 | Ranucci | H01L 21/823418 257/288 |
| 8,008,970 | B1 * | 8/2011 | Homol | H03F 3/72 330/296 |
| 8,373,449 | B2 | 2/2013 | Thiele et al. | |
| 8,653,583 | B2 * | 2/2014 | Parthasarathy | H01L 29/7815 257/328 |
| 2005/0231177 | A1 * | 10/2005 | Tateno | H02M 3/1588 323/225 |
| 2010/0134150 | A1 * | 6/2010 | Park | H02M 3/00 327/89 |
| 2013/0057241 | A1 * | 3/2013 | Shuvalov | H03K 17/122 323/271 |
| 2015/0061643 | A1 * | 3/2015 | Aerts | G01R 19/0092 324/123 R |
| 2015/0115985 | A1 * | 4/2015 | Gambetta | G01R 19/00 324/713 |

* cited by examiner

SEMICONDUCTOR DEVICE AND POWER CIRCUIT INCLUDING A SENSE TRANSISTOR FOR CURRENT SENSING

CROSS REFERENCE TO RELATED APPLICATION(S)

The present application claims priority to International Patent Application No. PCT/IB2014/001072, entitled "SEMICONDUCTOR DEVICE AND POWER CIRCUIT INCLUDING A SENSE TRANSISTOR FOR CURRENT SENSING," filed on May 16, 2014, the entirety of which is herein incorporated by reference.

FIELD OF THE INVENTION

This invention relates to a semiconductor device and to a power circuit.

BACKGROUND OF THE INVENTION

Many circuits that incorporate a power switch comprise a current sensor for sensing the electrical current that passes through the power switch. A valve current regulation circuit may be one example of such a circuit. A power switch may be connected in series with a load. Information about the load current can thus be obtained by sensing the current that passes through the power switch. This information can be used to control and/or limit the load current, for example, or to detect when a certain current level is reached. Current sensing circuits comprising sense transistors are commonly used. However, such circuits may be inaccurate for high load currents because of matching issues between the power transistors and the sense transistors.

SUMMARY OF THE INVENTION

The present invention provides a semiconductor device and a power circuit as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale.

DETAILED DESCRIPTION OF THE PREFERRED EMBODIMENTS

Figure 1:
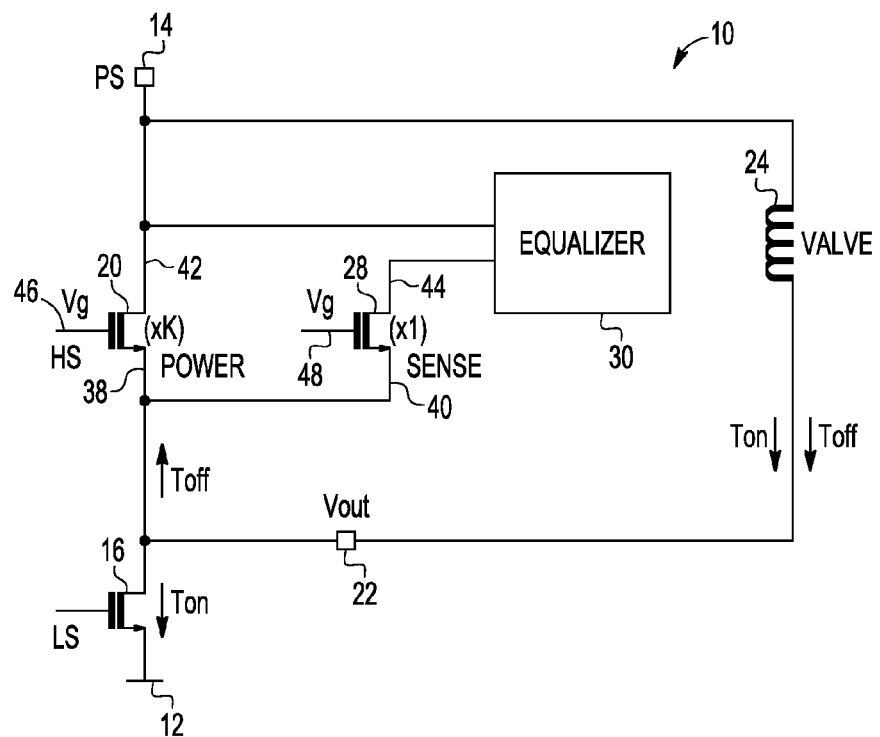
FIG. 1 schematically shows an example of an embodiment of a power circuit.

FIG. 1 schematically shows an example of a power circuit 10 for powering a load 24. The load 24 may, for example, be an induction coil of a valve, e.g., in a motor car. The load 24 may, however, be any other kind of electrical load. The power circuit 10 may comprise terminals 12, 14 for powering the load 24. The terminals 12, 14 may, for example, be connected to a power supply (not shown), e.g., a battery or other direct-current (DC) power supply.

The power circuit 10 may comprise power switches 16 and 20 connected in series between a low-side terminal 12 (e.g., ground) and a high-side terminal 14. The switches 16 and 20 may be implemented as metal oxide semiconductor field-effect transistors (MOSFETS). They may notably be laterally diffused metal oxide semiconductor (LD MOS) transistors. The switches 16 and 20 may therefore also be referred to herein as the power transistors 16 and 20. The switch 16 may be referred to as the low-side switch 16 or low-side power transistor 16. The switch 20 may be referred to as the high-side switch 20 or high-side power transistor 20.

An output node 22 may be connected between the low-side switch 16 and the high-side switch 20. The potential at the output node 22 may be controlled by controlling the switches 16 and 20 in an appropriate manner. Closing the high-side switch 20, i.e., turning it on to make it conductive, while opening the low-side switch 16, i.e., turning it off to make it non-conductive, may raise the output potential, for example, pull it to the potential of the high-side terminal 14. In contrast, turning the high-side switch 20 off and the low-side switch 16 on may lower the output potential, for example, pull it to the potential of the low-side terminal 12. In the example, the load is connected between the output node 22 and the high-side terminal 14. Thus, the load 24 may be connected in parallel with the power transistor 20.

The switches 16 and 20 may, for example, be operated in a pulse width modulation (PWM) mode. The potential at the output node 22 may thus be pulled up and down in an alternating manner, with a duty cycle that determines the average power delivered to the load 24. When the low-side switch 16 is off and the high-side switch 20 is on, the latter may form part of a recirculation path which allows the current through the load 24 to keep flowing for a while. High-inductive voltage peaks, which could otherwise be generated by the load 24, may thus be avoided. The high-side switch 20 may be arranged to operate in linear (ohmic) mode.

In the example, the power circuit 10 includes a sense transistor 28 which may be arranged to conduct a current (sense transistor current) that is substantially proportional to the current (power transistor current) through the power transistor 20. More specifically, the ratio between the power transistor current and the sense transistor current may be approximately constant within a fairly large range of values of the power transistor current. In one example, the power transistor current I_power is K times the sense transistor current I_sense, that is I_power=K*I_sense, provided that the power transistor current is not greater than approximately 2 A (two amperes), for example. This proportionality between the sense transistor current and the power transistor current may be achieved by a design in which the power transistor 20 and the sense transistor 28 are structurally similar and operated at substantially the same operating point. The operating point of a transistor is the set of potentials applied at the terminals of the transistor.

Each of the power transistor 20 and the sense transistor 28 may have a source terminal, a drain terminal, and a gate terminal. In the example, the power transistor 20 has a source terminal 38, a drain terminal 42 and a gate terminal 46. The sense transistor 28 may have a source terminal 40, a drain terminal 44, and a gate terminal 48. Each transistor may further have a body terminal, which may also be referred to as a bulk terminal, and which may be shorted to the respective source terminal, for example. While the power transistor 20 and the sense transistor 28 may be similar in structure, the power transistor 20 may extend across a much greater area of the die than the sense transistor 28. In other words, the die area of the sense transistor 28 may be a fraction of the die area of the power transistor 20. The die area ratio between the power transistor 20 and the sense transistor 28 may determine the ratio K between the power transistor current and the sense transistor current when the two transistors 20 and 28 are operated at the same operating point, that is, when the potentials at their terminals are substantially identical.

Various schemes for operating a sense transistor at the operating point of an associated power switch may be envisioned. In the example, the source terminal 40 and the gate terminal 48 of the sense transistor 28 are shorted to the source terminal 38 and the gate terminal 46 of the power transistor 20, respectively. Furthermore, a feedback loop may be arranged to copy the potential from the drain terminal 42 of the power switch 20 to the drain terminal 44 of the sense transistor 28. In the example, the power circuit 10 comprises an equalizer unit 30 connected to the drain terminal 42 of the power transistor 20 and to the drain terminal 44 of the sense transistor 28. The equalizer unit 20 may be arranged, for example, to bias the drain terminal 44 of the sense transistor 28 to the drain potential of the power transistor 20. In a steady state condition, the drain potentials of the power transistor 20 and the sense transistor 28 may be substantially equal and a sense transistor current I_sense=I_power/K may flow through the sense transistor 28 and the equalizer unit 30. The sense current I_sense thus produced may be translated, for example, into a corresponding voltage level for further evaluation. In one example, the power switches 16 and 20 may be controlled on the basis of the sense current.

Figure 2:
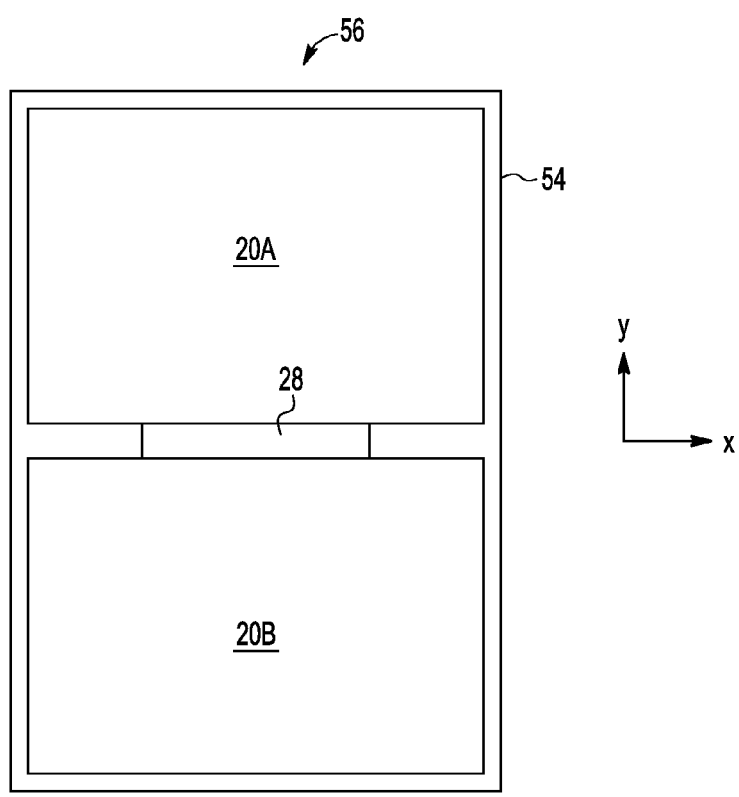
FIG. 2 schematically shows an example of an embodiment of a die comprising a power transistor and a sense transistor.

FIG. 2 provides a schematic top-view of an example of a portion of a die 56 comprising the high-side switch (high-side power transistor) 20. In the example, the power transistor 20 is formed of two transistors 20A and 20B connected in parallel. The transistors 20A and 20B may be located on opposite sides of the sense transistor 28. As shown, the horizontal (xy) dimensions of the sense transistor 28 may be significantly smaller compared to the power transistor 20. For example, the die area occupied by the power transistor 20 may be at least five times greater than the die area occupied by the sense transistor 28. The die 56 may comprise an isolation ring 54 which surrounds the transistors 20, 28 at least partially.

Figure 3:
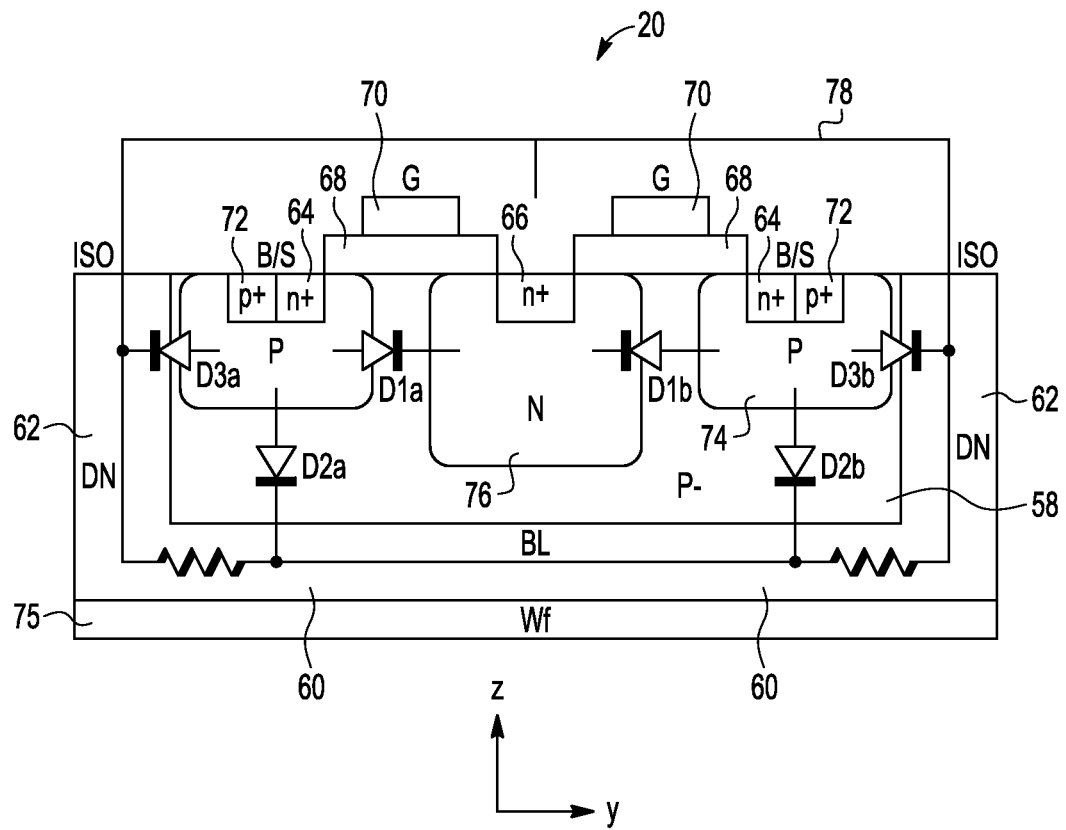
FIG. 3 schematically shows a cross section of an example of an embodiment of a power transistor.

FIG. 3 schematically shows a vertical section of an example of a power transistor, e.g., the power transistor 20 in FIG. 1. The power transistor 20 may be a MOSFET. In the example, the power transistor 20 is a LD MOSFET. The power transistor 20 may be embedded in a die 56, e.g., the die 56 mentioned above in reference to FIG. 2. Only a portion of the die 56 is shown in FIG. 3. The power transistor 20 may comprise an inner region 58 which may be generally of type P− (P minus) (so called epitaxy), a buried layer 60 which may be of type N, and an isolating barrier 62 which also may be of type N and which may surround the inner region 58 at least partially. The isolating barrier 62 may thereby electrically isolate the power transistor 20 against adjacent regions of the die 56. The power transistor 20 may further comprise a source region 64 which may be of type N+ (N plus) and a drain region 66 which may also be of type N+. The source region 64 and the drain region 66 may be conductively connected, e.g., shorted, respectively to the source terminal 38 and the drain terminal 42 (see FIG. 1), respectively. In the example, the power transistor 20 comprises two source regions 64 which may be arranged symmetrically on two opposite sides of the drain region 66. In a variant (not shown) of the power transistor 20, there is only one source region 64. The region between the source region 64 and the drain region 66 may be referred to as a drift region or a channel region as it may conduct electrons when a suitable electrical field is applied. A gate electrode 70 and a gate isolation layer 68 may be stacked atop of the drift region. The gate isolation area 68 may electrically isolate the gate electrode 70 from the drift region. The gate isolation layer 68 may, for example, comprise an oxide. The gate electrode 70 may be conductive, e.g., formed of polysilicon, and be connected to the gate terminal 46 (see FIG. 1). The region 74 may also be referred to as the body region or as the bulk region. The source region 64 may be shorted to the body region. The die 56 may comprise a substrate layer 75, which may be of type P. The buried layer 60 may be placed atop of the substrate layer 75. The inner region 58 may be located atop the buried layer 60.

A region 72 of type P+ (P plus) (body/bulk contact) may be arranged adjacent to the source region 64, e.g., adjacent to the side of the source region 64 that faces away from the drift region. In other words, the source region 64 may be located between the region 72 of type P+ and the drift region. The P+ region 72 and the source region 64 may be arranged inside a P-type region 74 arranged inside the inner region 58. Furthermore, the drain region 66 may be arranged inside an N-type region 76 located inside the inner region 58.

The P-type region 74, the inner region 58, and the N-type region 76 may together form horizontal diodes D1A and D1B. Similarly, the P-type region 74, the inner region 58, and the buried layer 60 may together form vertical diodes D2A and D2B (vertical iso-body diodes). Furthermore, the P-type region 74, the inner region 58, and the isolating barrier 62 may together form horizontal diodes D3A and D3B D2B (horizontal iso-body diodes).

In a variant of the shown example, the conductivity types of the various regions of the die 56 may be reversed. That is, a region of type N may be replaced by a region of type P and vice versa.

The structure shown in FIG. 3 may be repeated a number of times in the Y direction, that is, in a horizontal direction, although this is not shown in the Figures. In other words, the power transistor 20 may comprise a periodic succession of structures similar or identical to the one shown in FIG. 3. The various elements of this succession may be connected in parallel. The power transistor 20 can thus be made suitable for conducting high currents, e.g., up to several amperes.

Figure 4:
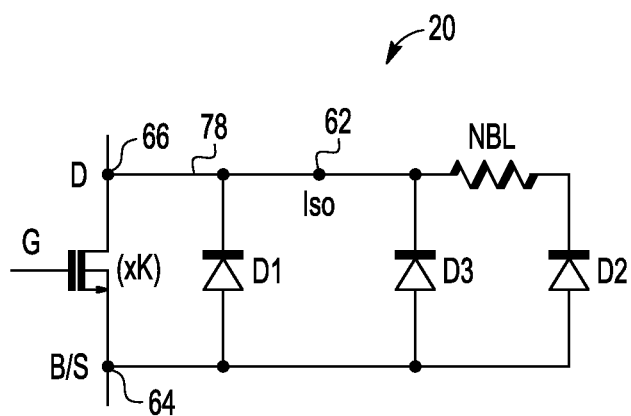
FIG. 4 shows a circuit diagram of an example of an embodiment of a power transistor.

FIG. 4 shows a circuit diagram of the example of a power transistor 20. The diode D1 in FIG. 4 may represent the horizontal diodes D1A and D1B. The diode D3 may represent the horizontal diodes D3A and D3B. The isolating barrier 62 may be shorted to the drain region 66. As seen, a conductive path comprising the second diode D2 and a resistance NBL may be formed between the source region 64 and the isolating barrier 62. The resistance NBL may comprise at least part of the resistance of the buried layer 60.

Figure 6:
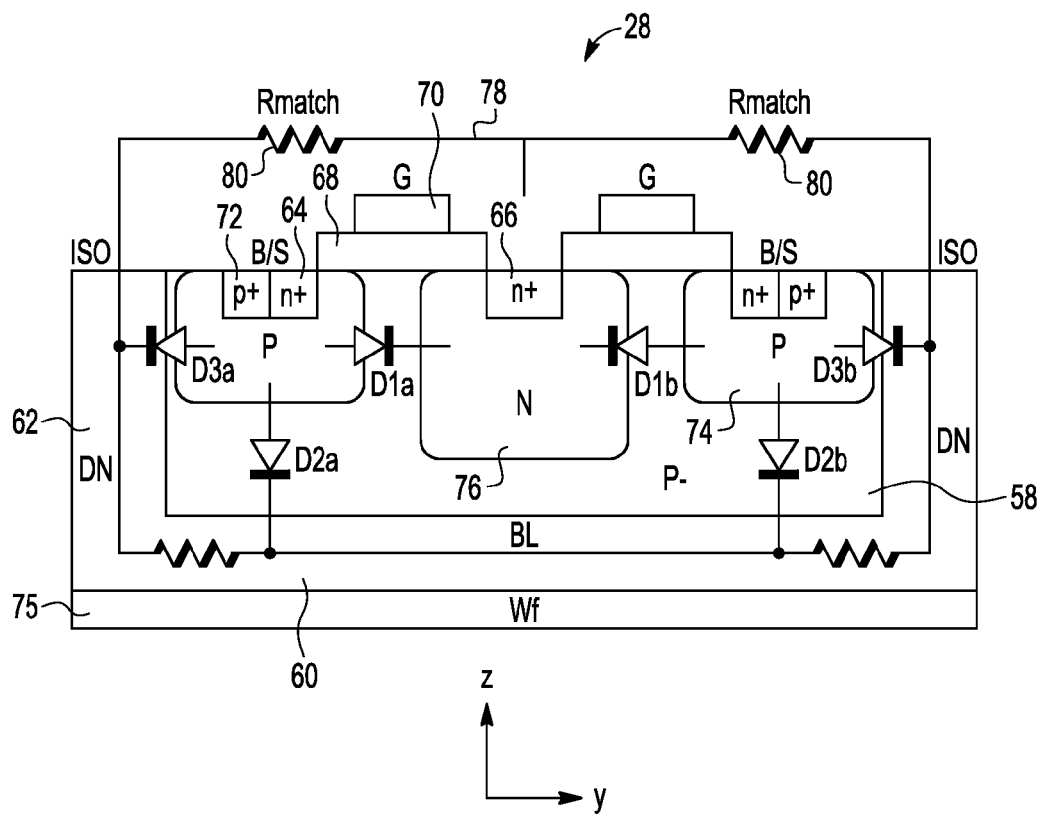
FIG. 6 schematically shows a cross section of an example of an embodiment of an improved sense transistor.

The sense transistor 28 may be implemented using a doped structure similar to the structure represented in FIG. 3. Accordingly, each of the regions or layers 58 to 76 may have a counterpart region or layer in the sense transistor 28, as shown in FIG. 6, wherein the x and y directions define a horizontal plane. Corresponding features of the power transistor 20 and the sense transistor 28 are designated herein using the same reference numbers. For example, the inner region 58 of the power transistor 20 may have a corresponding inner region 58 of the sense transistor 28. It is noted, however, that the lateral dimensions of the sense transistor 28, i.e., its horizontal dimensions, may be smaller than those of the power transistor 20. As a consequence, the sense transistor current may be not strictly proportional to the power transistor current. More specifically, the iso-body diodes D2 and D3 of the sense transistor 28 may draw a higher current than the iso-body diodes D2 and D3 of the power transistor divided by K. A first reason is that the resistance NBL of the buried layer 60 of the sense transistor 28 may be smaller than the buried layer resistance of the power transistor 20, which may be favourable to the conductivity of the iso-body diode D2 of the sense transistor 28. A second reason is that the sense transistor 28 may have a perimeter-to-area ratio which may be higher compared to the power transistor 20, and this may be favourable to the conductivity of the iso-body parameter diode D3 of the sense transistor 28.

Figure 5:
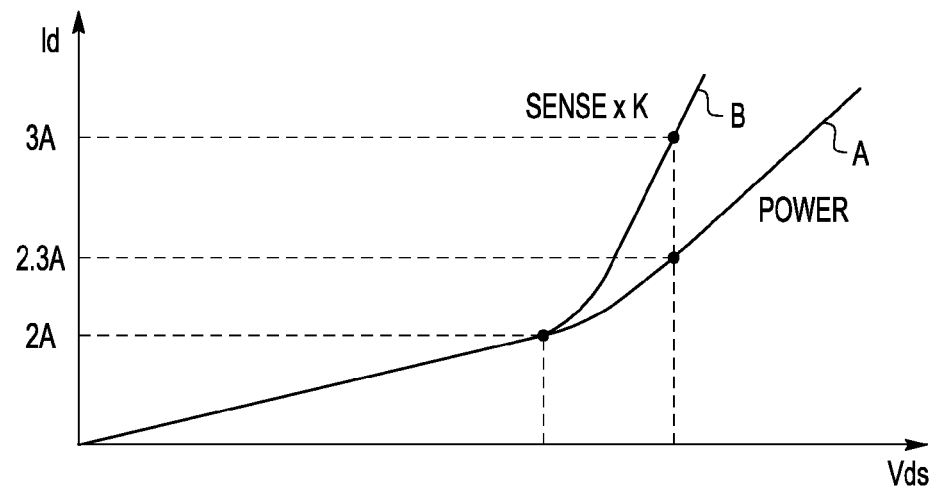
FIG. 5 shows a diagram of a power transistor current and a sense transistor current.

The plot in FIG. 5 schematically illustrates a possible violation of the proportionality between the power transistor current and the sense transistor current. Graph A in the plot shows the power transistor current as a function of the drain-to-source voltage of the power transistor 20, in an example scenario. Graph B shows the sense transistor current multiplied by the proportionality factor K as a function of the drain-to-source voltage of the sense transistor 28. In the example, the sense transistor current multiplied by K is equal to the power transistor current when the power transistor current is less than approximately two amperes. When the power transistor current exceeds two amperes, the sense transistor current multiplied by K noticeably exceeds the power transistor current, and the proportionality between the power transistor current (graph A) and the sense transistor current (graph B) is not respected. Depending on the details of the implementation, the point at which the sense transistor current multiplied by K significantly exceeds the power transistor current may be less or greater than two amperes.

FIG. 6 schematically illustrates an example of an embodiment of a sense transistor 28 that has a structure largely similar to the power transistor 20 and which may have a better proportionality between the sense transistor current and the power transistor current. In the example, the resistance between the drain region 66 and the isolating barrier 62 is chosen higher compared to the power transistor 20. In other words, the power transistor 20 and the sense transistor 28 may each comprise a barrier-to-drain connector 78 which connects the isolating barrier 62 to the drain region 66, wherein the barrier-to-drain connector 78 of the sense transistor 28 has an electrical resistance which is higher compared to the power transistor 20. The resistance of the barrier-to-drain connector 78 of the sense transistor 28 may be arranged to match with the resistance of the buried layer 60 of the power transistor 20 and to compensate for the greater conductivity of the diodes D2 and D3 of the sense transistor 28 relative to the power transistor 20. The iso-body diodes of the sense transistor 28 may thus draw proportionally as much current as the iso-body diodes of the power transistor and the proportionality between the power transistor current and the sense transistor current may be extended to higher current levels.

Figure 7:
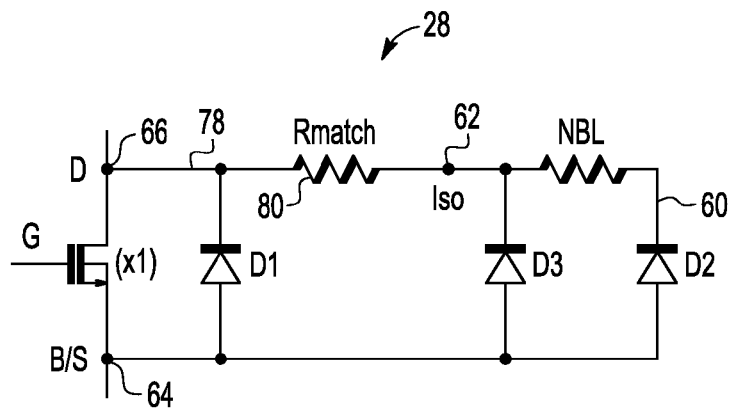
FIG. 7 shows a circuit diagram of an example of an embodiment of an improved sense transistor.

A circuit diagram representative of the thus modified sense transistor 28 is given in FIG. 7.

There may be various options for implementing the barrier-to-drain connectors 78 of the power transistor 20 and the sense transistor 28. Whereas the barrier-to-drain connector 78 of the power transistor 20 may have a negligible electrical resistance, the barrier-to-drain connector 78 of the sense transistor may have a non-negligible electrical resistance. The barrier-to-drain connector 78 of the sense transistor 28, may, for example, comprise a resistor 80, that is, a dedicated resistive element, or a series of such elements, with an electrical resistance chosen so as to optimize the proportionality between the sense transistor current and the power transistor current. At least a part of the barrier-to-drain connector 78 of the power transistor 20 may traverse a region of the die 56. Similarly, at least a part of the barrier-to-drain connector 78 of the sense transistor 28 may traverse a region of the die 56.

In one example, the resistor is a metal or polysilicon resistor. The metal or polysilicon resistor may comprise a resistive metal or polysilicon and may be located on the surface of the silicon in the neighbourhood of the sense transistor 28, for example. In another example, the resistor is a diffused resistor. The diffused resistor may be diffused inside the silicon in the neighbourhood of the sense transistor 28, for example.

Figure 8:
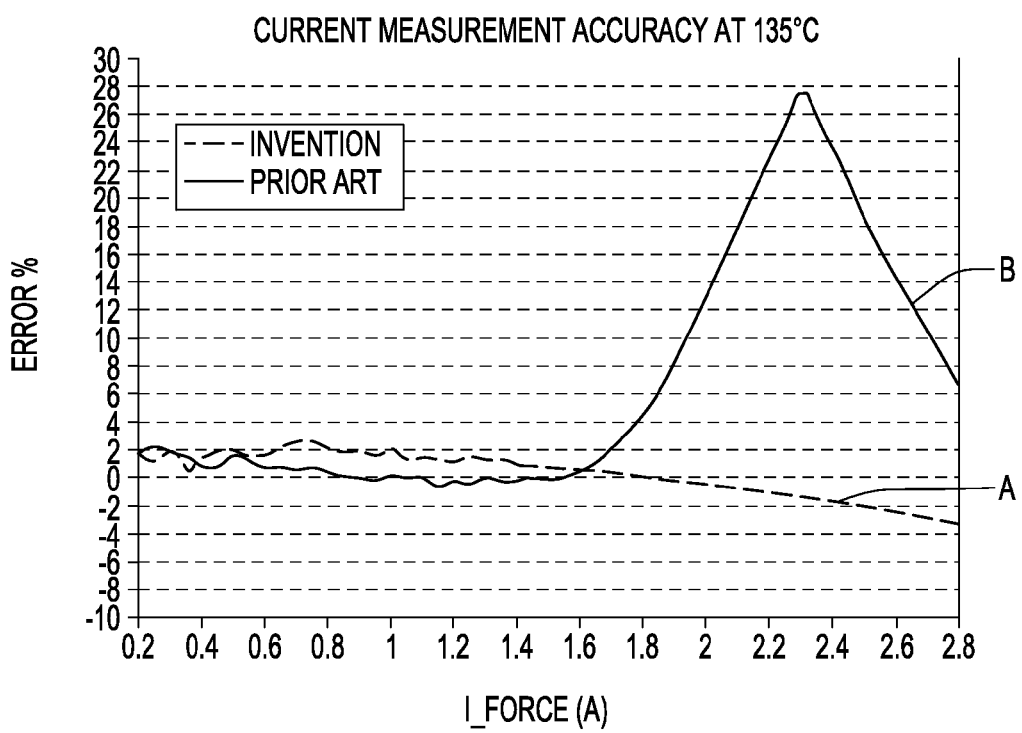
FIG. 8 shows a diagram of a current sense error measured with an earlier and with an improved current sense transistor.

FIG. 8 shows a plot of the relative error of the sense transistor current relative to the power transistor current as a function of the power transistor current, for an earlier implementation (graph B) of a sense transistor 28 and a modified implementation (graph A) as described above with reference to FIGS. 6 and 7 in which the barrier-to-drain connector of the sense transistor 28 has an electrical resistance which is higher compared to the power transistor 20. In this example measurement, the error for power transistor currents higher than approximately 1.6 amperes is seem to be significantly reduced as a consequence of the added resistance of the barrier-to-drain connector of the sense transistor 28.

In the foregoing specification, the invention has been described with reference to specific examples of embodiments of the invention. It will, however, be evident that various modifications and changes may be made therein without departing from the broader spirit and scope of the invention as set forth in the appended claims.

The terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although specific conductivity types or polarity of potentials have been described in the examples, it will be appreciated that conductivity types and polarities of potentials may be reversed.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Also for example, in one embodiment, the illustrated examples may be implemented as circuitry located on a single integrated circuit or within a same device. For example, the power device 10 may be implemented as a single integrated circuit. Alternatively, the examples may be implemented as any number of separate integrated circuits or separate devices interconnected with each other in a suitable manner. For example, the control unit 52 and the switches 16 and 20 may be located on separate integrated circuits.

Also for example, the examples, or portions thereof, may implemented as soft or code representations of physical circuitry or of logical representations convertible into physical circuitry, such as in a hardware description language of any appropriate type.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements The mere fact that certain measures are recited in mutually different claims does not indicate that a combination of these measures cannot be used to advantage.

The invention claimed is:

1. A semiconductor device comprising a power transistor and a sense transistor, wherein
   the power transistor is arranged to conduct a power transistor current;
   the sense transistor is arranged to conduct a sense transistor current that is substantially proportional to the power transistor current;
   each of the power transistor and the sense transistor is a metal-oxide semiconductor field effect transistor, MOSFET, having a drain terminal, a source terminal, and a gate terminal;
   the drain terminal, the source terminal, and the gate terminal of the sense transistor are arranged to be biased to the drain potential, the source potential, and the gate potential of the power transistor, respectively;
   wherein the power transistor and the sense transistor each comprise:
   an inner region of type P−;
   an N-type buried layer;
   an N-type isolating barrier, the isolating barrier surrounding the inner region at least partially;
   an N-type source region in the inner region;
   an N-type drain region in the inner region; and
   a barrier-to-drain connector which connects the isolating barrier to the drain region;
   wherein the barrier-to-drain connector of the sense transistor has an electrical resistance which is higher than the resistance of the barrier-to-drain connector of the power transistor.

2. The semiconductor device of claim 1, wherein the barrier-to-drain connector of the sense transistor comprises a resistor.

3. The semiconductor device of claim 2, wherein the resistor is a surface mounted device.

4. The semiconductor device of claim 1, comprising a die which comprises at least part of the power transistor and at least part of the sense transistor.

5. The semiconductor device of claim 4, wherein at least part of the barrier-to-drain connector traverses a region of the die.

6. The semiconductor device of claim 4, wherein the power transistor and the sense transistor are located adjacent to each other.

7. The semiconductor device of claim 1, wherein the die area occupied by the power transistor is at least five times greater than the die area occupied by the sense transistor.

8. The semiconductor device of claim 1, wherein the power transistor and the sense transistor each comprise a horizontal diode between the source region and the drain region.

9. The semiconductor device of claim 1, wherein the power transistor and the sense transistor each comprise a vertical diode between the source region and the buried layer.

10. The semiconductor device of claim 1, wherein the power transistor and the sense transistor each comprise a horizontal diode between the source region and the isolating barrier.

11. The semiconductor device of claim 1, wherein the power transistor and the sense transistor are similar in structure.

12. A power circuit comprising a semiconductor device of claim 1 and a load, wherein the load is connected or connectable in parallel with the power transistor.

13. The power circuit of claim 12, wherein the load is an inductive load and the power transistor is connectable in series with the load to form a recirculation path.

14. The power circuit of claim 12, comprising a feedback loop arranged to control the power switch in dependence of the sense transistor current.

* * * * *